United States Patent
Fischer et al.

(10) Patent No.: US 11,651,986 B2
(45) Date of Patent: May 16, 2023

(54) SYSTEM FOR ISOLATING ELECTRODES AT CRYOGENIC TEMPERATURES

(71) Applicant: Applied Materials, Inc., Santa Clara, CA (US)

(72) Inventors: Jonathan D. Fischer, Lynn, MA (US); Steven M. Anella, West Newbury, MA (US); Manohara Kumar, Karnataka (IN)

(73) Assignee: Applied Materials, Inc., Santa Clara, CA (US)

(*) Notice: Subject to any disclaimer, the term of this patent is extended or adjusted under 35 U.S.C. 154(b) by 339 days.

(21) Appl. No.: 17/159,638

(22) Filed: Jan. 27, 2021

(65) Prior Publication Data

US 2022/0238365 A1    Jul. 28, 2022

(51) Int. Cl.
| | |
|---|---|
| H01T 23/00 | (2006.01) |
| H01L 21/683 | (2006.01) |
| H01L 21/67 | (2006.01) |
| H02N 13/00 | (2006.01) |

(52) U.S. Cl.
CPC .... *H01L 21/6833* (2013.01); *H01L 21/67103* (2013.01); *H02N 13/00* (2013.01)

(58) Field of Classification Search
None
See application file for complete search history.

(56) References Cited

U.S. PATENT DOCUMENTS

| | | | |
|---|---|---|---|
| 5,196,789 A * | 3/1993 | Golden | G01R 1/06722 324/755.05 |
| 5,197,904 A * | 3/1993 | Gold | H01R 13/504 439/736 |
| 6,023,405 A | 2/2000 | Shamouilian et al. | |
| (Continued) | | | |

FOREIGN PATENT DOCUMENTS

| | | |
|---|---|---|
| EP | 0545748 A1 | 6/1993 |
| JP | 2015-220368 A | 12/2015 |
| WO | 2019/235874 A1 | 12/2019 |

OTHER PUBLICATIONS

International Search Report and Written Opinion dated Apr. 11, 2022 in corresponding PCT application No. PCT/US2021/063810.

*Primary Examiner* — Stephen W Jackson

(74) *Attorney, Agent, or Firm* — Nields, Lemack & Frame, LLC

(57) ABSTRACT

An insulating system to reduce or eliminate the possibility of arcing while the pressure within a chamber is being varied is disclosed. The system is operable at cryogenic temperatures, such that the insulating system is able to accommodate dimensional changes due to thermal contraction. The insulating system, which includes a housing having one or more bores, is disposed between the two components which are to be electrically connected. An electrical contact, which may be spring loaded, passes through the bore and is used to electrically connect the two components. The ends of the electrical contact are surrounded by an insulating extender which extends from the housing. In one embodiment, a spring-loaded piston is used as the insulating extender. This (Continued)

insulating extender compensates for changes in dimension due to thermal contraction and covers the portion of the electrical contact that extends beyond the outer surface of the housing.

20 Claims, 7 Drawing Sheets

(56) References Cited

U.S. PATENT DOCUMENTS

| | | | | |
|---|---|---|---|---|
| 6,638,088 | B1 * | 10/2003 | Richardson | F21V 19/009 |
| | | | | 439/242 |
| 11,196,204 | B2 * | 12/2021 | Schwarz | H01R 24/50 |
| 2005/0007133 | A1 | 1/2005 | Hembree | |
| 2017/0140958 | A1 | 5/2017 | Kitagawa et al. | |
| 2021/0231706 | A1 | 7/2021 | Pak | |

* cited by examiner

SYSTEM FOR ISOLATING ELECTRODES AT CRYOGENIC TEMPERATURES

FIELD

Embodiments of this disclosure are directed to systems for isolating electrodes, and more particularly for isolating electrodes at temperatures at which thermal contraction occurs.

BACKGROUND

There are various situations in which two components, each having electrical contacts, or electrodes, on their outer surfaces are connected together to form an electrical connection.

For example, in some semiconductor processing systems, the electrostatic chuck may include a plurality of electrodes on its bottom surface that are intended to mate with corresponding connections on the base. These electrodes may be formed as flat conductive regions on the bottom surface of the platen. The base may include a plurality of electrodes, so as to accommodate different components within the electrostatic chuck. In certain embodiments, variable length metal pins, also referred to as "pogo pins", may extend from the base and may be used to electrically connect to the electrodes on the electrostatic chuck.

This connection mechanism is effective in many embodiments. However, in certain embodiments, the base and electrostatic chuck may be maintained at cryogenic temperatures. These extreme cold temperatures cause thermal contraction, such that the width of the gap between the electrostatic chuck and the base changes.

Further, as the pressure within the chamber varies, the probability of arcing changes. As explained by Paschen's Law, the voltage at which an arc occurs, or the breakdown voltage, is a non-linear function of the gas, the gap distance, and the pressure. At near vacuum conditions, the breakdown voltage is very high, as there are few molecules to carry the current. Further, at higher pressures, such as atmospheric pressure, the breakdown voltage is high. However, there is a pressure, between pure vacuum and atmospheric pressure, where the breakdown voltage is a minimum. For example, in an argon environment with a gap of 1 cm, the breakdown voltage is in excess of 10,000 V at atmospheric pressure and at vacuum. However, at a pressure of 1 torr, the breakdown voltage may be about 200 V.

Therefore, as the pressure in a chamber is being changed, there is a possibility that an arc occurs as the pressure inside the chamber reaches the pressure where the breakdown voltage is less than the applied voltage. Thus, an arc is possible as the chamber is vented to atmosphere or pumped down to vacuum conditions.

Therefore, it would be advantageous if there were a system to minimize or eliminate the possibility of arcing as the pressure is varied. Additionally, it would be beneficial if the system reduced the energy of an arc, should one occur. It would be beneficial if this system were operable at cryogenic temperatures or over a wide range of temperatures where thermal contraction may occur.

SUMMARY

An insulating system to reduce or eliminate the possibility of arcing while the pressure within a chamber is being varied is disclosed. The system is operable at cryogenic temperatures, such that the insulating system is able to accommodate dimensional changes due to thermal contraction. The insulating system, which includes a housing having one or more bores, is disposed between the two components which are to be electrically connected. An electrical contact, which may be spring loaded, passes through the bore and is used to electrically connect the two components. The ends of the electrical contact are surrounded by an insulating extender which extends from the housing. In one embodiment, a spring-loaded piston is used as the insulating extender. This insulating extender compensates for changes in dimension due to thermal contraction and covers the portion of the electrical contact that extends beyond the outer surface of the housing. The insulating extender is used to increase the arc path, reduce the possibility of arcing and reduce arc energy, should one occur.

According to one embodiment, an insulating system is disclosed. The insulating system comprises a housing having a first surface and a second surface; a bore extending from the first surface toward the second surface, such that the bore comprises an open end at the first surface and a closed end proximate the second surface; an opening disposed in the closed end, configured such that an electrical contact may pass through the opening and the bore and extend from the second surface and past the first surface; and an insulating extender extending outward from the first surface and surrounding an end of the electrical contact. In certain embodiments, the housing comprises a ceramic material or a plastic. In some embodiments, the insulating extender comprises a piston disposed within the bore and proximate the first surface; wherein the piston comprises a hollow cylinder through which the electrical contact passes; wherein the piston comprises an insulating material; and further comprising a spring disposed in the bore between the piston and the closed end, biasing the piston to extend beyond the first surface. In certain embodiments, the insulating system comprises an O-ring disposed on an outer surface of the piston. In some embodiments, a diameter of the piston is such that an entirety of the piston fits within the bore. In some embodiments, the piston comprises a cylindrical portion that fits within the bore and an outward protrusion having a diameter greater than a diameter of the bore such that a portion of the piston is always disposed outside the housing. In some embodiments, an outer surface of the piston disposed within the bore comprises a groove, and wherein a screw or pin passes through the housing and enters the groove so as to hold the piston captive such that a range of motion of the piston is limited to a length of the groove.

According to another embodiment, a semiconductor processing system is disclosed. The semiconductor processing system comprises a base comprising one or more electrical contacts; an electrostatic chuck having one or more chuck electrodes; and an insulating system, disposed between the base and the electrostatic chuck, wherein the insulating system comprises: a housing having a first surface and a second surface, wherein the second surface of the housing is disposed proximate the base; a bore extending from the first surface toward the second surface, such that the bore comprises an open end at the first surface and a closed end proximate the second surface; an opening disposed in the closed end, configured such that one of the one or more electrical contacts from the base passes through the opening and the bore, extends from the second surface past the first surface and contacts one of the one or more chuck electrodes; and an insulating extender extending outward from the first surface and surrounding an end of the one of the one or more electrical contacts. In certain embodiments, the second surface of the housing is disposed proximate the base. In some embodiments, the second surface is glued to the base using an epoxy. In some embodiments, a sheet of material having a high dielectric constant is disposed between the base and the second surface. In some embodiments, O-rings are disposed between the base and the second surface.

According to another embodiment, an insulating system is disclosed. The insulating system comprises a housing having a first surface and a second surface, having a bore therethrough extending from the first surface to the second surface, configured such that an electrical contact may pass through the bore; and an insulating extender disposed proximate the first surface and the second surface and surrounding two ends of the electrical contact, wherein the insulating extender extends outward from at least one of the first surface and the second surface. In certain embodiments, the housing comprises a ceramic material or a plastic. In some embodiments, the insulating extender comprises a bellows that is disposed through a length of the bore and surrounds the electrical contact. In some embodiments, the insulating extender comprises two pistons disposed within the bore; wherein a first piston is proximate the first surface and a second piston is proximate the second surface; wherein each piston comprising a hollow cylinder through which the electrical contact passes; wherein each piston comprises an insulating material; and a spring is disposed in the bore, biasing the first piston outward beyond the first surface and biasing the second piston outward beyond the second surface. In certain embodiments, the insulating system comprises an O-ring disposed on an outer surface of the first piston and an O-ring disposed on an outer surface of the second piston. In some embodiments, a diameter of the pistons is such that an entirety of the pistons fits within the bore. In certain embodiments, the pistons each comprise a cylindrical portion that fits within the bore and an outward protrusion having a diameter greater than a diameter of the bore such that a portion of the pistons is always disposed outside the housing.

According to another embodiment, a semiconductor processing system is disclosed. The semiconductor processing system comprises a base comprising one or more electrical contacts; an electrostatic chuck having one or more chuck electrodes; and an insulating system, disposed between the base and the electrostatic chuck, wherein the insulating system comprises: a housing having a first surface and a second surface, wherein the second surface of the housing is disposed proximate the base; a bore extending from the first surface to the second surface, configured such that one of the one or more electrical contacts passes through the bore and contacts one of the one or more chuck electrodes; and an insulating extender disposed proximate the first surface and the second surface and surrounding two ends of the one of the one or more electrical contacts, wherein the insulating extender extends outward from at least one of the first surface and the second surface. In certain embodiments, the insulating extender comprises two pistons disposed within the bore; wherein a first piston is proximate the first surface and a second piston is proximate the second surface; wherein each piston comprising a hollow cylinder through which the one of the one or more electrical contact passes; wherein each piston comprises an insulating material; and further comprising a spring disposed in the bore, biasing the first piston and the second piston outward.

BRIEF DESCRIPTION OF THE FIGURES

For a better understanding of the present disclosure, reference is made to the accompanying drawings, which are incorporated herein by reference and in which.

DETAILED DESCRIPTION

The present disclosure describes a system to insulate electrodes on a component from arcing to one another, wherein the components may be subject to thermal expansion or contraction.

Figure 1A:
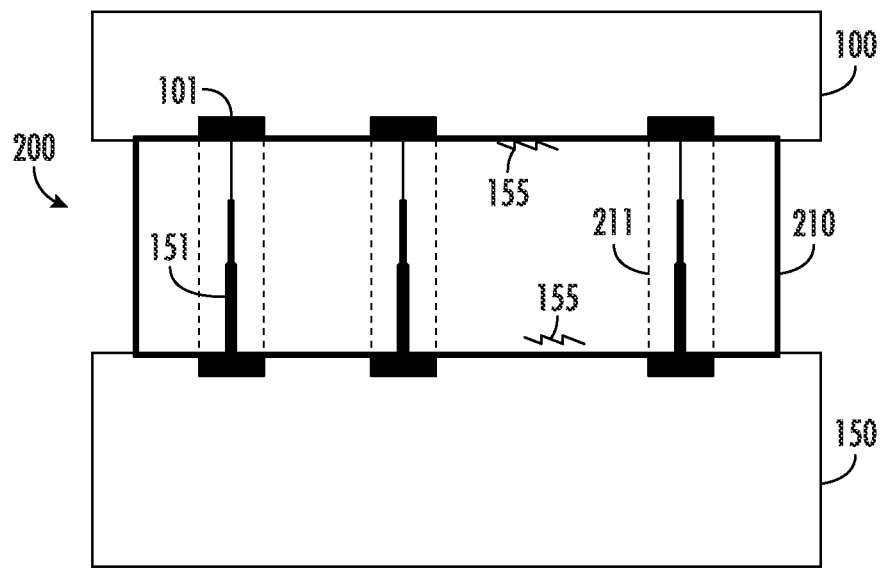
FIG. 1A shows one embodiment of two components and the insulating system at room temperature.

FIG. 1A shows two components where the first component includes one or more electrodes on its outer surface. The second component includes electrical contacts 151 that extend from the second component to the electrodes on the first component. In one embodiment, the first component may be an electrostatic chuck 100, having one or more chuck electrodes 101. The chuck electrodes 101 may be conductive regions disposed on the bottom surface of the electrostatic chuck 100.

The second component may be a base 150 of the semiconductor processing system. More specifically, the second component may be an adapter plate. The base 150 includes one or more electrical contacts 151 extending from the surface of the base 150. Each electrical contact 151 may be used to supply a voltage to a corresponding chuck electrode 101 on the electrostatic chuck 100. The electrical contacts 151 may have a variable length and may be referred to as "pogo pins". The voltages supplied to the electrostatic chuck 100 may vary and are not limited by this disclosure. The spacing between the electrical contacts 151 may vary and may be as small as ⅜ inches, although other separation distances are also possible. As described above, the combination of pressure, separation distance and voltage determines the likelihood of an arc. Thus, if the separation distance is small, arcs may occur at relatively low voltages.

Disposed between the electrostatic chuck 100 and the base 150 is an insulating system 200. The insulating system 200 includes a housing 210 is made of an insulating material. One or more bores 211 pass through part or the entirety of the housing 210, and no more than one electrical contact 151 is disposed in each bore 211. At room temperature, the housing 210 of insulating system 200 may be dimensioned such that there are no gaps between the insulating system 200 and the base 150 and between the insulating system 200 and the electrostatic chuck 100. By eliminating these gaps, it is not possible for an arc 155 to travel along the surface of the electrostatic chuck 100 between two chuck electrodes 101 or along the surface of the base 150 between two electrical contacts 151.

While the first and second components are described as the electrostatic chuck 100 and the base 150, the disclosure is not limited to this embodiment. The insulating system 200 may be used between any two components that are to be electrically connected, where the distance between the two components may vary. Further, while FIGS. 1A-1B disclose the electrical contacts 151 extending from the base 150 to the chuck electrodes 101, it is understood that the configuration may be altered such that the electrical contacts 151 extend from the chuck electrodes to the base electrodes. Alternatively, the electrical contacts 151 may be separate from the base 150 and the electrostatic chuck 100.

Figure 1B:
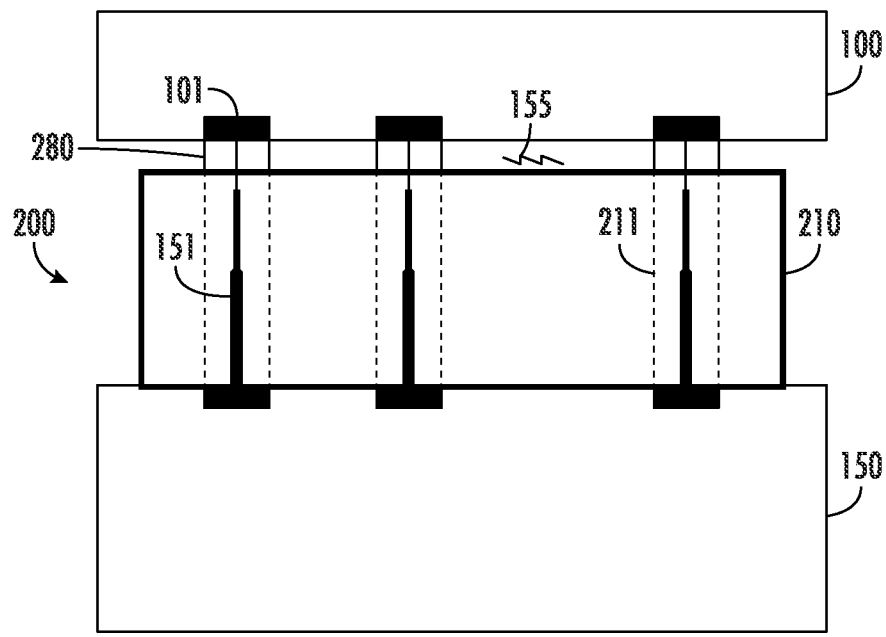
FIG. 1B shows the two components and the insulating system of FIG. 1A at cryogenic temperatures, where thermal contraction has created a gap.

FIG. 1B shows the two components of FIG. 1A, as well as the insulating system 200, at cryogenic temperatures, such as −100° C. or less. Due to the extreme temperatures, thermal contraction has occurred such that the dimension of the housing 210 of the insulating system 200 is now smaller than the gap between the base 150 and the electrostatic chuck 100. In certain embodiments, this gap may be ¼" or more. Without modification, there may be a path over which an arc 155 may travel between adjacent electrical contacts 151. The arc 155 may travel along or near the surface of the base 150. Alternatively, the arc 155 may travel along or near the surface of the electrostatic chuck 100.

To address this potential failure, the insulating system 200 advantageously also includes an insulating extender 280 which extends outward from the housing 210 of the insulating system 200 to cover the exposed ends of the electrical contacts 151. These insulating extenders 280 may extend from the bores 211 such that the electrical contacts 151 are surrounded throughout their length by the housing 210 and/or the insulating extenders 280.

The insulating system 200 may be formed in a variety of ways.

Figure 2:
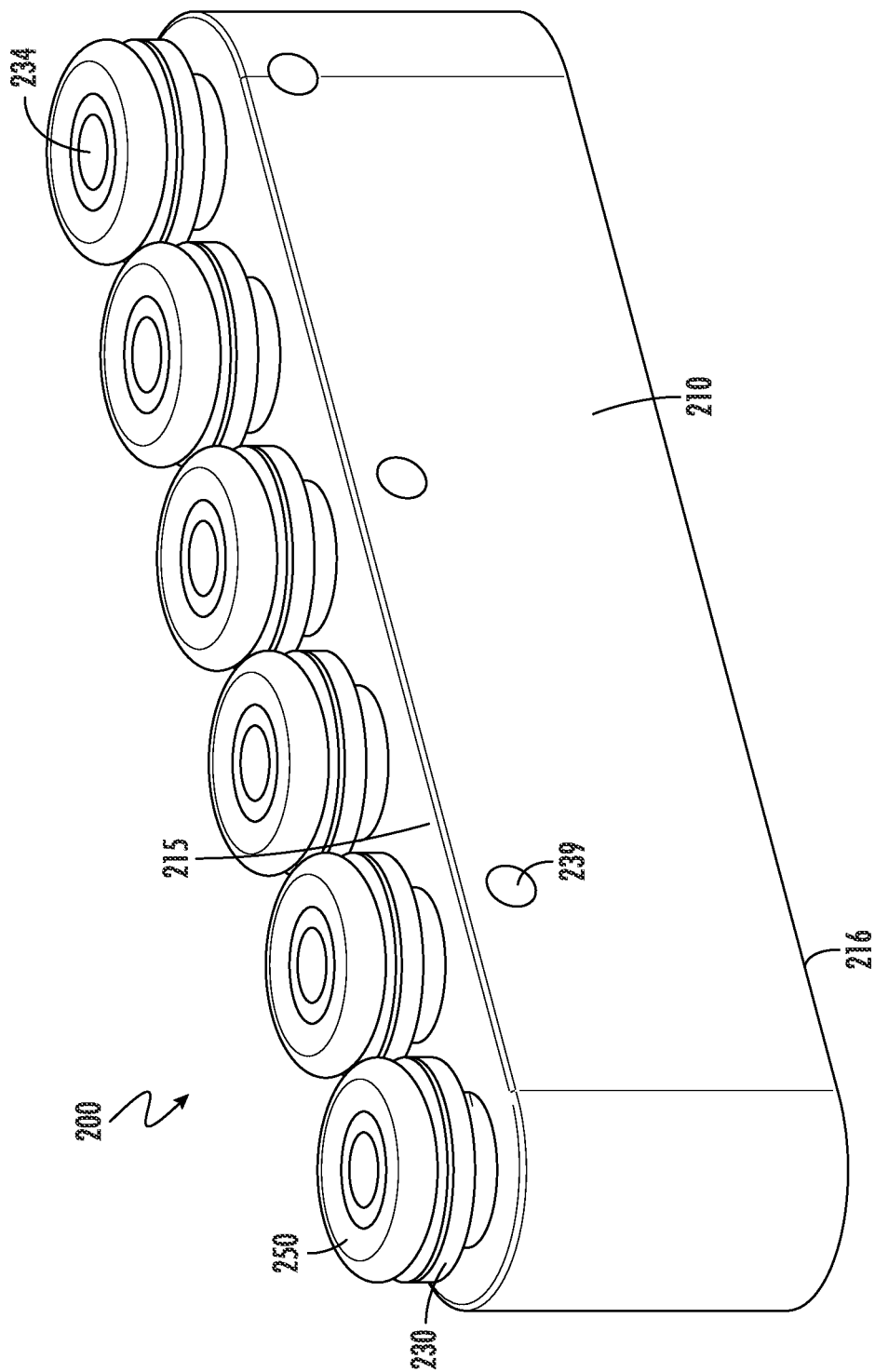
FIG. 2 is an insulating system that may be disposed between the two components according to one embodiment.
Figure 3:
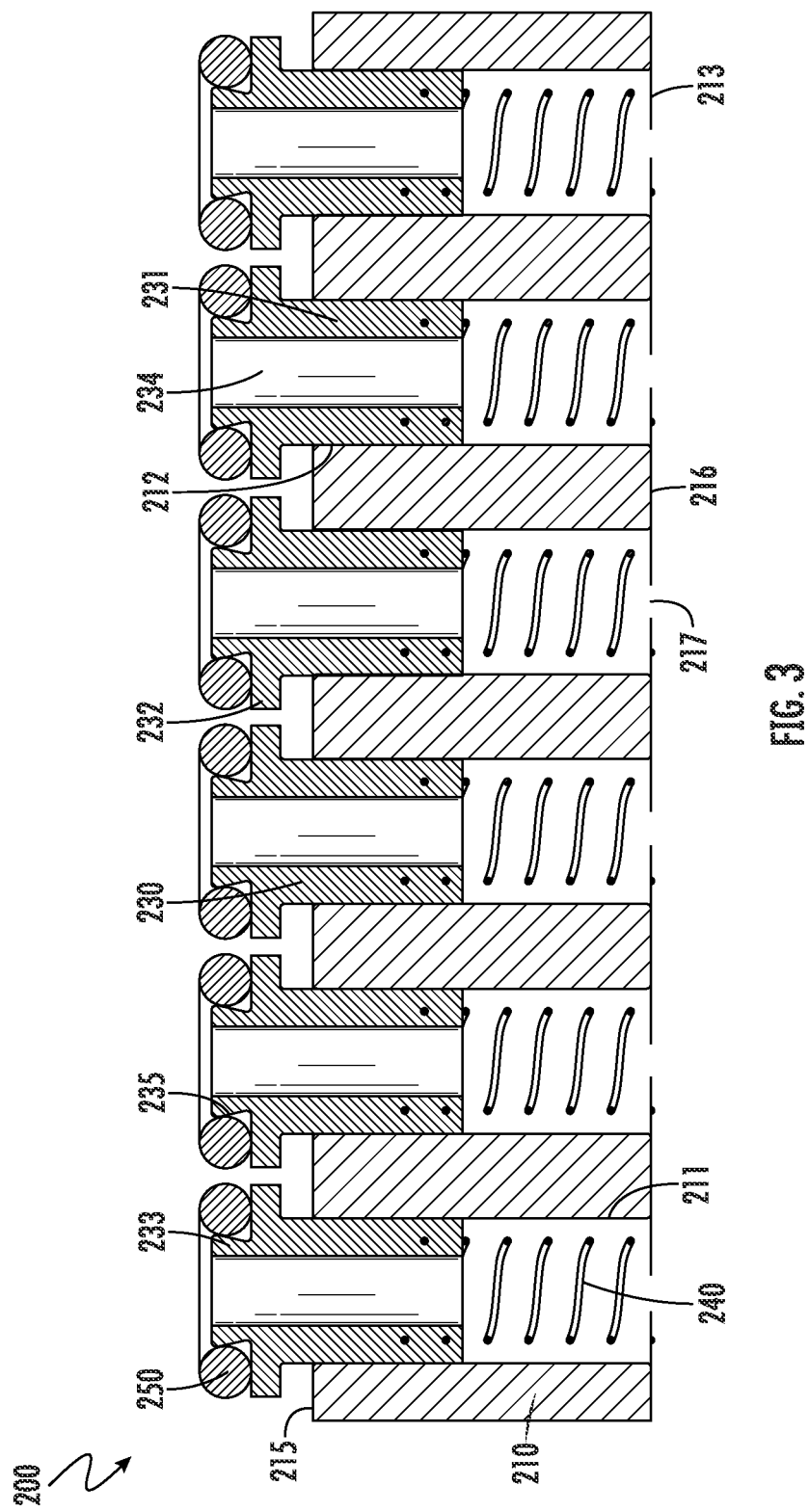
FIG. 3 shows a cross-section of the insulating system of FIG. 2.
Figure 4:
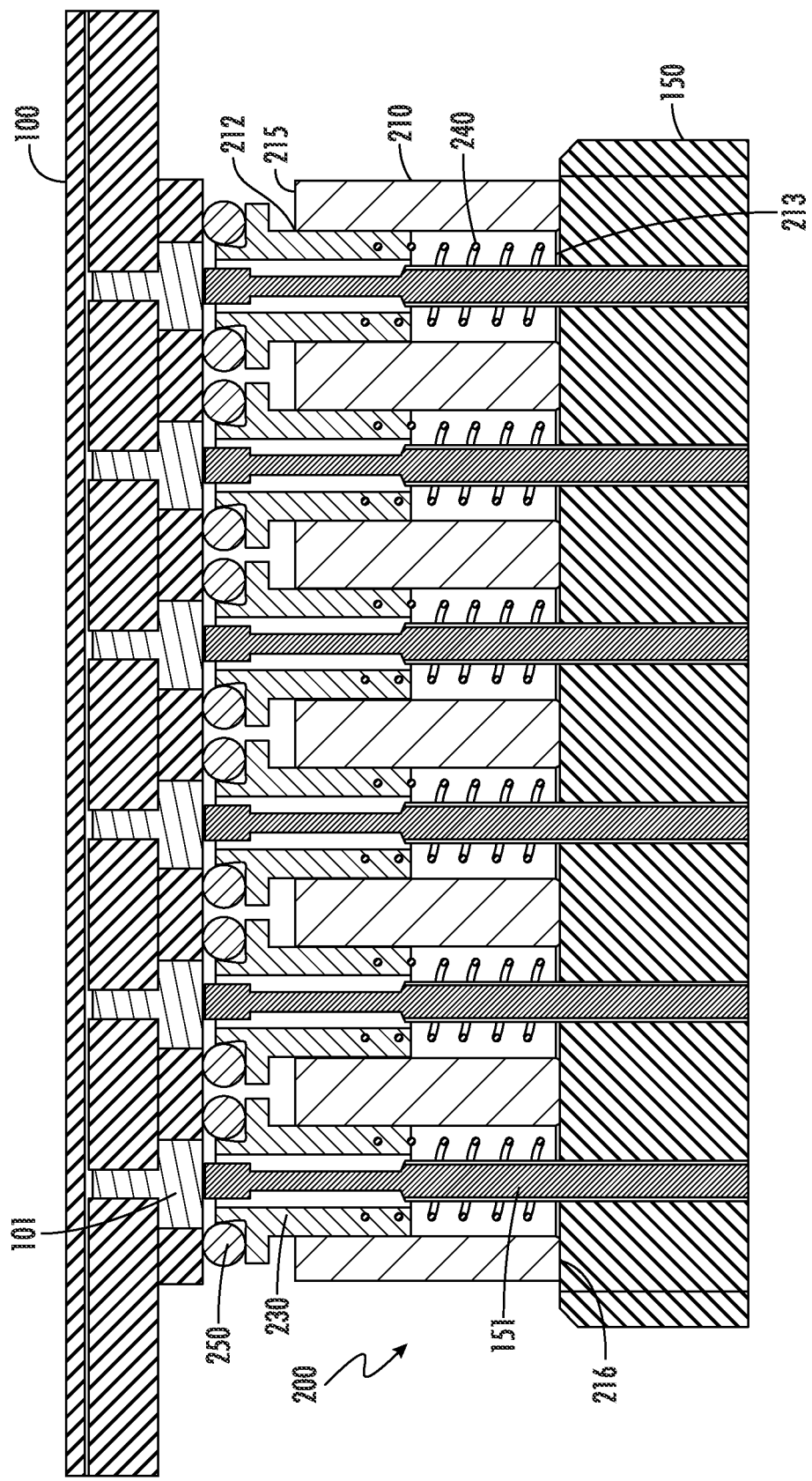
FIG. 4 shows the insulating system of FIG. 3 disposed in a semiconductor processing system.
Figure 5:
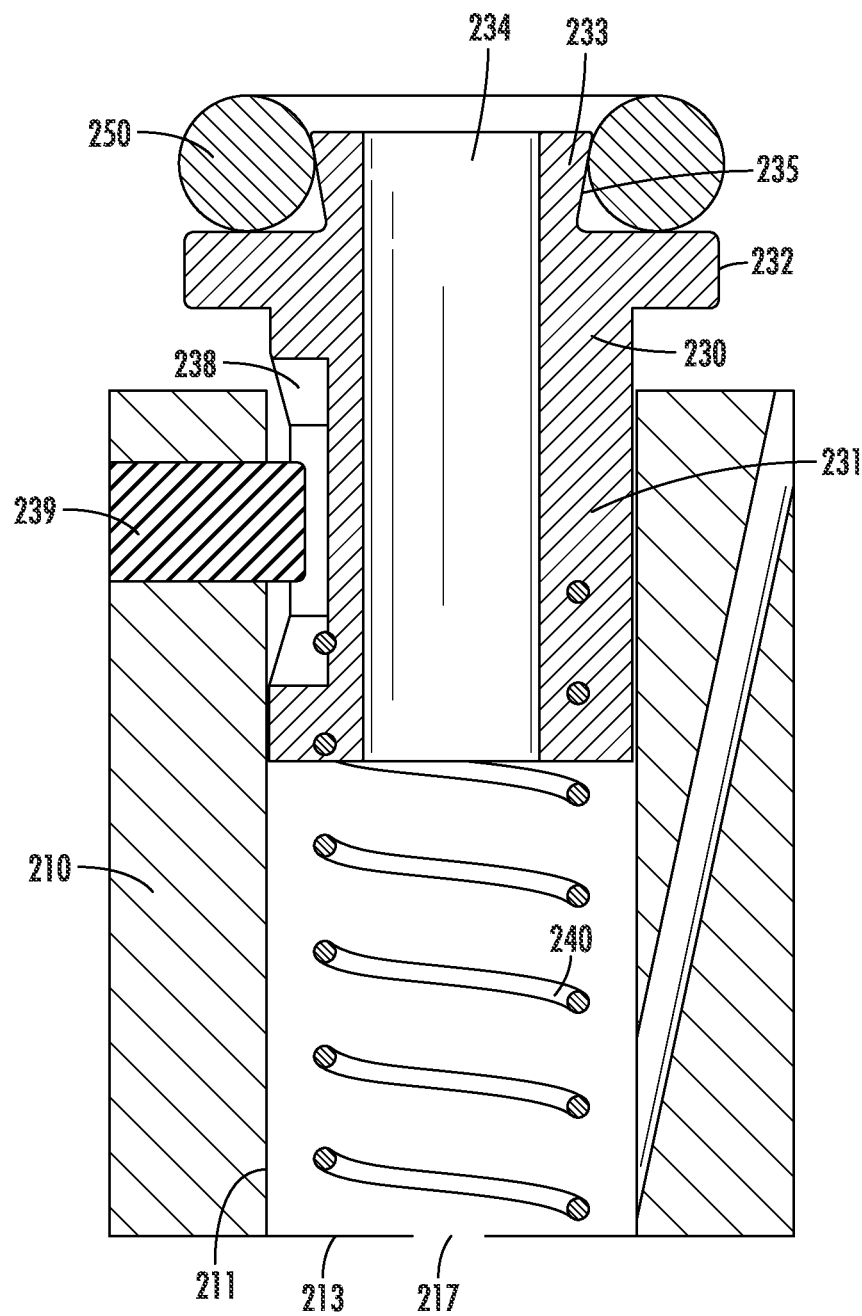
FIG. 5 shows a retention mechanism that may be used to hold the piston in place.

FIGS. 2-5 show the insulating system 200 according to one embodiment. FIG. 2 shows the exterior of the insulating system 200, while FIG. 3 is a cross-section of the insulating system 200. FIG. 4 shows a cross-section in which the insulating system 200 is disposed between an electrostatic chuck 100 and a base 150. FIG. 5 shows the retention mechanism to hold the piston 230 in place.

As shown best in FIG. 4, the insulating system 200 is disposed between the two components, such as between the electrostatic chuck 100 and the base 150. The insulating system 200 may be any desired height, such as between 0.25 and 6 inches. In certain embodiments, the height may be less than one inch.

The insulating system 200 comprises a housing 210. The housing 210 is comprised of a high dielectric strength material. Further, the coefficient of thermal expansion of the housing 210 is less than or equal to the coefficient of thermal expansion of the two components. In this way, regardless of temperature, the housing 210 does not expand to a height that is greater than the separation distance between the two components. In certain embodiments, the housing 210 may be constructed of a ceramic material, such as $Al_2O_3$ or sapphire. In other embodiments, the housing 210 may be constructed of a plastic, such as polyether ether ketone (PEEK). The housing 210 includes a first surface 215 and a second surface 216.

One or more bores 211 are created through the housing 210 in the height direction extending from the first surface 215 and not reaching the second surface 216. Thus, the bore 211 has an open end 212 and a closed end 213. The bores 211 are used to create a cavity that holds the elements that serve to connect and insulate the electrodes of the base 150 and the electrostatic chuck 100. The diameter of the bores 211 is less than the separation distance between adjacent electrical contacts 151. In this way, the material used for the housing 210 also separates adjacent cavities. The closed end 213 of the bore 211 has an opening 217 through which the electrical contact 151 may pass, as best seen in FIG. 3.

Several elements are disposed within each bore 211. For example, as described above, an electrical contact 151 is disposed within the bore 211. The electrical contact 151 is used to electrically connect a signal, power or ground on the base 150 to the corresponding chuck electrode 101. As described above, the electrical contact 151 may be spring-loaded, which may also be referred to as a "pogo pin". In this embodiment, the electrical contact 151 comprises a plurality of concentric tubes, which are electrically conductive. A spring is disposed within the concentric tubes and serve to bias the end of the pogo pin outward. This allows the electrical contact 151 to expand and contract as the temperature of the base 150 and electrostatic chuck 100 changes, while maintaining physical and electrical contact with chuck electrode 101. The electrical contact 151 has a first end that contacts an electrode on a first component, which may be the electrostatic chuck 100, and a second end that extends outward from a second component, which may be a base 150 of a semiconductor processing system.

A piston 230 may be disposed at the open end 212 of the bore 211, proximate the first surface 215. The piston 230 may be constructed of an insulating material, such as PEEK or another suitable material.

As best seen in FIG. 3, the piston 230 has a cylindrical portion 231, having a height, and diameter. The outer diameter of the cylindrical portion 231 may be slightly less than the diameter of the bore 211. Thus, in this embodiment, the cylindrical portion 231 fits within the bore 211. The gap between the cylindrical portion 231 and the bore 211 does not have to be air tight. Above the cylindrical portion 231 is an outward protrusion 232. The outer diameter of the outward protrusion 232 is greater than the diameter of the bore 211, such that the outward protrusion 232 is always disposed outside of the bore 211. The outward protrusion 232 has a first surface that faces the first surface 215 and a second surface that faces toward the electrostatic chuck 100. When fully compressed, the first surface of the outward protrusion 232 may rest against the first surface 215. Above the outward protrusion is a capture portion 233. The capture portion 233 is part of the piston 230 and has an inward sloping wall 235 that meets the second surface of the outward protrusion 232 at an acute angle. The combination of the inward sloping wall 235 and the second surface of the outward protrusion 232 form a structure that may be used to capture and hold an O-ring 250.

A hollow cylinder 234 is disposed through the height of the piston 230 so that the electrical contact 151 may pass though the piston 230.

A spring 240 is disposed in the bore 211, and presses against the closed end 213 of the bore 211 and the piston 230. In other words, the spring 240 is disposed between the closed end 213 and the piston 230. The spring 240 serves to bias the piston 230 outward. The spring 240 may be conductive or non-conductive. In certain embodiments, the spring 240 may be a nickel alloy. The spring 240 may be preloaded so as to exert ounces of outward force on the piston 230. In certain embodiments, the spring 240 may exert a force of less than 1 pound of force, such as about 0.5 pounds of force. In this way, the piston 230 is capable of extending beyond the first surface 215.

In certain embodiments, as shown in FIG. 5, the piston 230 is captive within the housing 210. In other words, while the piston 230 may extend beyond the first surface 215 of the housing 210, the piston 230 is retained by the housing 210 and cannot fall out of the bore 211. This may be achieved by disposing a groove 238 on the outer surface of the piston 230, such as along the outer surface of the cylindrical portion 231. A screw or pin 239 may be inserted through a hole in the housing 210 and into the groove 238. Insertion of the screw or pin 239 limits the range of motion of the piston 230 to the length of the groove 238, holding the piston 230 captive.

As noted above, an O-ring 250 may be disposed on the outside surface of the piston 230. The O-ring 250 may be made of silicone or another insulating material. In this embodiment, the outer diameter of the O-ring 250 may be greater than the diameter of the bore 211, since the O-ring 250 is always outside the bore 211. The O-ring 250 may form a seal around the end of the electrical contact 151 and against the electrostatic chuck 100 so as to prevent arcing along or near the surface of the component. The piston 230 and the O-ring 250 surround the electrical contact 151 so that the electrical contact 151 is not exposed outside of the housing 210. In certain embodiments, the O-ring 250 is captive to the outside surface of the piston 230, as described above.

Additionally, in certain embodiments, holes may be formed through the housing 210 and into the bore 211 so as to allow the interior of the bore 211 to be in communication with the exterior of the housing 210. This allows air or other gases to be exhausted from the bore 211, such that the pressure within the bore 211 is the same as the outside environment in the chamber. In certain embodiments, the holes may be angled so as to increase their length, further minimizing arc probability and energy. In other embodiments, the holes are not utilized.

As shown in FIG. 4, the insulating system 200 is disposed between the electrostatic chuck 100 and the base 150. The O-rings 250 contact the electrostatic chuck 100. On the opposite side of the insulating system 200, various techniques may be used to provide the insulation for the electrical contacts 151.

In one embodiment, O-rings (not shown) may be disposed on the second surface 216 of the housing 210, wherein the electrical contacts 151 pass through the O-rings. The O-rings may prevent arcs from occurring between adjacent electrical contacts 151 along the surface of the base 150.

In another embodiment, a sheet of dielectric material, such as silicone, may be disposed on the top surface of the base 150. This sheet may have holes that are aligned with the electrical contacts 151 so that the electrical contacts 151 are free to pass through the sheet. The insulating system 200 may then be disposed on this sheet. The sheet may prevent arcs from occurring between adjacent electrical contacts 151 along the surface of the base 150.

In another embodiment, the insulating system 200 may be affixed to the base 150. For example, an epoxy having a high dielectric constant may be used to affix the insulating system 200 to the base 150. The epoxy may prevent arcs from occurring between adjacent electrical contacts 151 along the surface of the base 150.

Of course, the insulating system 200 may be disposed between the electrostatic chuck 100 and the base 150, such that the first surface is proximate the base 150. In this embodiment, the O-rings, epoxy or dielectric material may be disposed proximate the electrostatic chuck.

Thus, in this embodiment, the insulating system 200 comprises a housing 210 having one or more bores 211 passing in the height direction from the first surface 215 and not reaching the second surface 216, so as to create an open end 212 and a closed end 213. An opening 217 may be created in the closed end 213 so that the electrical contacts 151 may pass into and through the bore 211. An insulating extender, which may be a piston 230, is inserted into the open end 212 and may be biased outward by a spring 240. An O-ring 250 may be disposed on the end of the piston 230. A hollow cylinder 234 is created through the piston 230 so that the electrical contact 151 may pass through the piston 230.

In this way, the path to be travelled by an arc is significantly lengthened. The path from one electrical contact 151 to the adjacent electrical contact can be described as follows. The voltage first travels up the electrical contact 151, because the O-ring 250 prevents the arc from travelling along the surface of the base 150 outside of the housing 210. Further, within the bore 211, the piston 230 prevents the voltage from arcing. Thus, the arc has to form beyond the cylindrical portion 231 of the piston 230. Thus, a taller cylindrical portion 231 further increases the path length of an arc. The arc then travels down the space between the piston 230 and the bore 211 until it reaches the exterior surface of the housing 210. The arc then travels along the outer surface of the housing 210 to the adjacent bore 211. The arc then travels up the space between the piston 230 and the adjacent bore 211, past the cylindrical portion 231 of the adjacent piston 230. The arc then travels to the electrical contact 151. Thus, the path length is significantly longer than that which previously existed, minimizing or eliminating the possibility of an arc.

Figure 6:
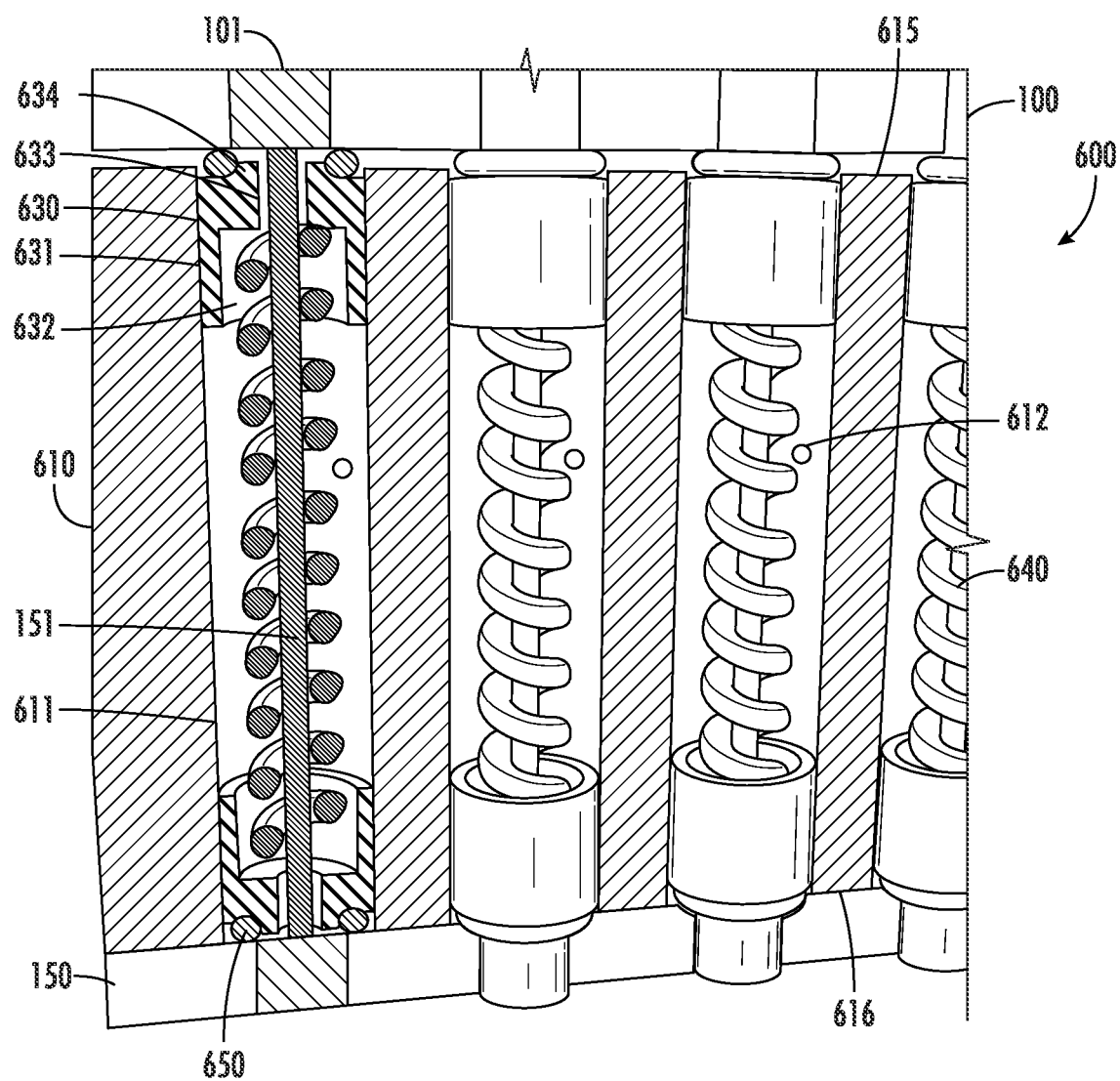
FIG. 6 is an insulating system that may be disposed between the two components according to another embodiment.

FIG. 6 shows an insulating system 600 according to another embodiment. As described above, the insulating system 600 is disposed between the two components, such as between the electrostatic chuck 100 and the base 150. The insulating system 200 may be any desired height, such as between 1 and 6 inches.

Like the previous embodiment, the insulating system 600 comprises a housing 610. The housing 610 is comprised of a high dielectric strength material. Further, the coefficient of thermal expansion of the housing 610 is less than or equal to the coefficient of thermal expansion of the two components. In this way, regardless of temperature, the housing 610 does not expand to a height that is greater than the separation distance between the two components. In certain embodiments, the housing 610 may be constructed of a ceramic material, such as $Al_2O_3$ or sapphire. In other embodiments, the housing 610 may be constructed of a plastic, such as polyether ether ketone (PEEK). The housing 610 includes a first surface 615 and a second surface 616.

One or more bores 611 are created through the housing 610 in the height direction extending from the first surface 615 to the second surface 616 such that the bores 611 pass entirely through the housing 610. The bores 611 are used to create a cavity that holds the elements that serve to connect and insulate the electrodes of the base 150 and the electrostatic chuck 100. The diameter of the bores 611 is less than the separation distance between adjacent electrical contacts 151. In this way, the material used for the housing 610 also separates adjacent cavities.

Several elements are disposed within each bore 611. For example, an electrical contact 151 is disposed within the bore 211. The electrical contact 151 is used to electrically connect a signal, power or ground in the base 150 to the corresponding chuck electrode 101. As described above, the electrical contact 151 may be spring-loaded, which may also be referred to as a "pogo pin". This allows the electrical contact 151 to expand and contract as the temperature of the electrostatic chuck and base 150 changes, while maintaining physical and electrical contact with the chuck electrode 101.

The electrical contact 151 has a first end that contacts an electrode on a first component, which may be the electrostatic chuck 100, and a second end that contacts a second component, which may be a base 150 of a semiconductor processing system. In certain embodiments, the electrical contact 151 may be a component of the base 150 and extend outward from the surface of the base 150.

Two pistons 630 may be disposed on the opposite ends of the bore 611, proximate the first surface 615 and the second surface 616, respectively. Specifically, a first piston is disposed proximate the first surface 615 and a second piston is disposed proximate the second surface 616. In certain embodiments, the first piston and the second piston are identical. The pistons 630 may be constructed of an insulating material, such as PEEK or another suitable material. The pistons 630 may be cylindrical, having a height, and diameter. The outer diameter of the piston 630 may be slightly less than the diameter of the bore 611. Thus, in this embodiment, the entire piston 630 fits within the bore 611. The gap between the piston 630 and the bore 611 does not have to be air tight. A hollow cylinder 633 is disposed through the height of each piston 630 so that the electrical contact 151 may pass though the pistons 630. Additionally, in certain embodiments, a counterbore 632 may be formed on the interior end of the pistons 630, so as to create a space to retain the end of spring 640. The portion of the piston 630 that remains on the interior end of the piston outside the counterbore 632 may be referred to as skirt 631. The height of the skirt 631 may vary, as described in more detail below.

A spring 640 is disposed in the counterbores 632 of two pistons 630, serving to bias the pistons 630 outward. The spring 640 may be conductive or non-conductive. In certain embodiments, the spring 640 may be a nickel alloy. The spring 640 may be biased so as to exert ounces of outward force on the pistons 630. In certain embodiments, the spring may exert a force of less than 1 pound of force, such as about 0.5 pounds of force. In this way, the pistons 630 are capable of extending beyond the first surface 615 and/or the second surface 616.

In certain embodiments, the pistons 630 are captive within the housing 610. In other words, while the pistons 630 may extend beyond the outer surface of the housing 610, the pistons 630 are retained by the housing 210 and cannot fall out of the bore 611. This may be achieved using the mechanism described above with respect to FIG. 5.

As shown in FIG. 6, an O-ring 650 may be disposed on the outside surface of each piston 630. The O-ring 650 may be made of silicone or another insulating material. The O-ring 650 may form a seal around the end of the electrical contact 151 and against the component so as to prevent arcing along or near the surface of the component. The piston 630 and the O-ring 650 surround the electrical contact 151 so that the electrical contact 151 is not exposed outside of the housing 210. In certain embodiments, the O-ring 650 is captive to the outside surface of the piston 630. For example, the outside surface of the piston 230 may be formed with an indented region 634, such that the O-ring 650 is disposed and retained in this indented region 634. Alternatively, a capture portion, such as that described in FIG. 3, may be used.

In this way, the path to be travelled by an arc is significantly lengthened. The path from one electrical contact 151 to the adjacent electrical contact can be described as follows. The voltage first travels up the electrical contact 151, because the O-ring 650 prevents the arc from travelling along the surface of the base 150 outside of the housing 610. Further, within the bore 611, the skirt 631 prevents the voltage from arcing. Thus, the arc has to form beyond the skirt 631. Thus, a taller skirt 631 further increases the path length of an arc. The arc then travels down the space between the piston 630 and the bore 611 until it reaches the exterior surface of the housing 610. The arc then travels along the outer surface of the housing 610 to the adjacent bore 611. The arc then travels up the space between the piston 630 and the adjacent bore 611, past the skirt 631. The arc then travels to the electrical contact 151. Thus, the path length is significantly longer than that which previously existed, minimizing or eliminating the possibility of an arc.

Additionally, in certain embodiments, holes 612 may be formed through the housing 610 and into the bore 611 so as to allow the interior of the bore 611 to be in communication with the exterior of the housing 610. This allows air or other gases to be exhausted from the bore 611, such that the pressure within the bore 611 is the same as the outside environment in the chamber.

Thus, in this embodiment, the insulating system 200 comprises a housing 610, having bores through its entire height. An electrical contact 151, which may be spring-loaded, is disposed in each bore 611 and adapted to contact electrodes on a component external to the insulating system 600. The ends of the electrical contact 151 may extend further than at least one of the outer surfaces of the housing 610. Thus, to prevent arcing, an insulating extender also extends from the outer surface of the housing 610 to cover the first end and/or the second end of the electrical contact 151. The insulating extender is also biased to push outward from the housing 610. In this way, the electrical contact 151 is not exposed outside the housing 610. In this embodiment, the insulating extender comprises two pistons 230 disposed at each end of the housing 610 and O-rings 650. To enable the insulating extender to extend beyond the outer surface of the housing 610, a spring 640 may be disposed in the bore to bias the pistons 630 outward.

The placement of the housing 610 may determine whether the first piston extends beyond the first surface 215, the second piston extends beyond the second surface 216, or whether both pistons extend beyond their respective surfaces.

Of course, other embodiments are also possible. For example, FIG. 6 shows a symmetrical configuration with pistons 630 disposed on both ends of the bore 611, wherein the pistons 630 fit entirely within the bore 611. In another embodiment, the embodiment of FIG. 6 may be modified to include only one piston 630 disposed near the first surface, similar to the embodiment shown in FIGS. 2-5.

Additionally, the embodiment shown in FIGS. 2-5, wherein the piston 230 comprises an outward protrusion 232 such that only a portion of the piston fits within the bore 211, may be modified to include two pistons, similar to that shown in FIG. 6.

Figure 7:
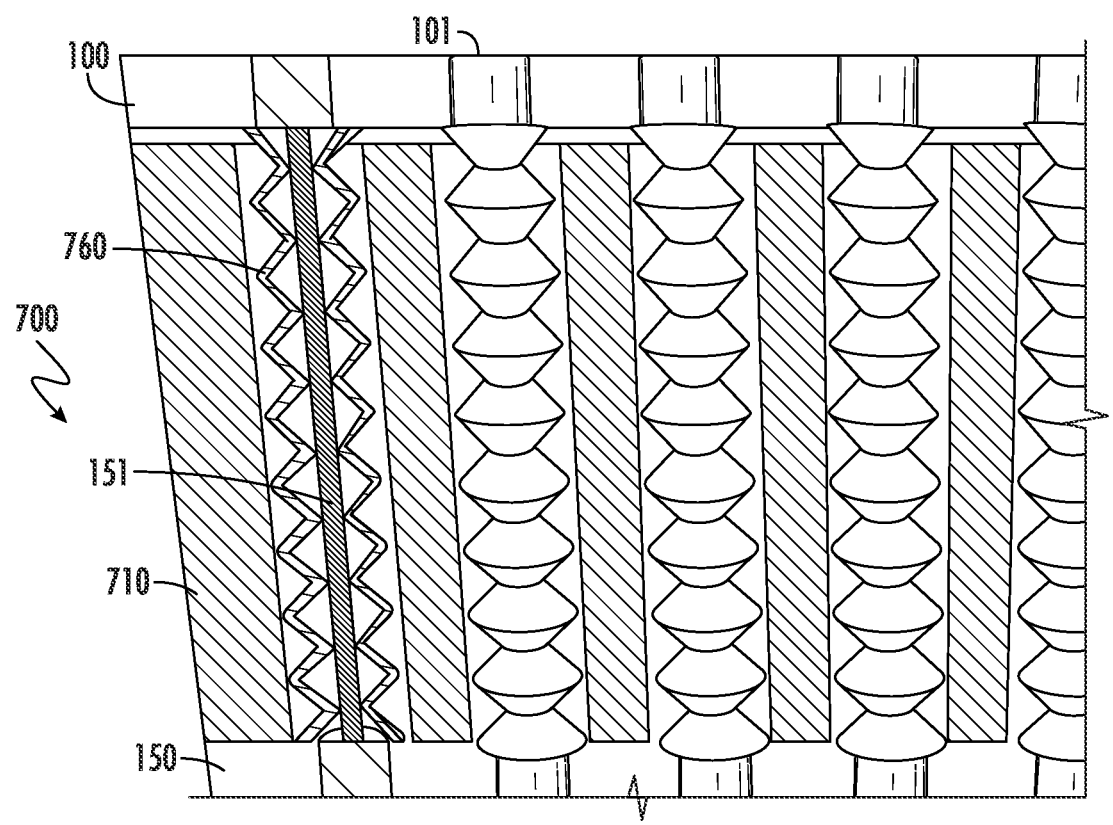
FIG. 7 is an insulating system that may be disposed between the two components according to a third embodiment.

FIG. 7 shows a third embodiment of an insulating system 700. In this embodiment, the insulating extender of FIG. 6 is replaced with a bellows 760. The bellows 760 may comprise silicone or another suitable insulating material. The bellows 760 may be a monolithic piece of silicone. The bellows 760 is configured such that it is under compression when contained within the housing 710. In this way, the bellows 760 is biased so as to extend beyond the housing 710. Since the bellows is pliable, it forms a seal around the end of the electrical contact 151 and against the component, preventing arcing along the surface of the component.

Thus, in this embodiment, the insulating extender is the bellows 760. Further, in this embodiment, the bellows 760 surrounds the electrical contact 151 throughout its length.

While the above disclosure describes the adjacent components as being the base 150 and the electrostatic chuck 100, it is understood that the insulating system described herein may be used to electrically connect any two components. Thus, the present insulating system is beneficial for any configuration where the pressure varies, the electrodes are used to provide high voltages and the system operates over a range of temperatures that cause thermal contraction or expansion.

The system described herein has many advantages. In certain embodiments, semiconductor processing system may include a base or adapter plate that is mated with the electrostatic chuck. At atmospheric pressures, there is no arcing. However, at cryogenic temperatures, the base and chuck contract, creating a larger gap between these components. Further, as the pressure decreases as the chamber is being pumped down, there may be a pressure where the breakdown voltage is less than the applied voltage. At this pressure, currently there are instances where an arc is created between adjacent electrodes on one of the components. This may damage and possibly destroy the component. By incorporating the insulating system described herein, the possibility of arcing is significantly reduced with no adverse consequences. Furthermore, thermal contraction does not inhibit the operation of the insulating system, as the insulating extenders are capable of movement so as to always surround the electrical contact, minimizing the possibility of an arc. Further, the insulating system can be easily incorporated into existing systems with no modifications to those components.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An insulating system, comprising:
a housing having a first surface and a second surface;
a bore extending from the first surface toward the second surface, such that the bore comprises an open end at the first surface and a closed end proximate the second surface;
an opening disposed in the closed end, configured such that an electrical contact may pass through the opening and the bore and extend from the second surface and past the first surface; and
an insulating extender extending outward from the first surface and surrounding an end of the electrical contact.

2. The insulating system of claim 1, wherein the housing comprises a ceramic material or a plastic.

3. The insulating system of claim 1, wherein the insulating extender comprises a piston disposed within the bore and proximate the first surface;
wherein the piston comprises a hollow cylinder through which the electrical contact passes;
wherein the piston comprises an insulating material; and
further comprising a spring disposed in the bore between the piston and the closed end, biasing the piston to extend beyond the first surface.

4. The insulating system of claim 3, further comprising an O-ring disposed on an outer surface of the piston.

5. The insulating system of claim 3, wherein a diameter of the piston is such that an entirety of the piston fits within the bore.

6. The insulating system of claim 3, wherein the piston comprises a cylindrical portion that fits within the bore and an outward protrusion having a diameter greater than a diameter of the bore such that a portion of the piston is always disposed outside the housing.

7. The insulating system of claim 3, wherein an outer surface of the piston disposed within the bore comprises a groove, and wherein a screw or pin passes through the housing and enters the groove so as to hold the piston captive such that a range of motion of the piston is limited to a length of the groove.

8. A semiconductor processing system, comprising:
a base comprising one or more electrical contacts;
an electrostatic chuck having one or more chuck electrodes; and
an insulating system, disposed between the base and the electrostatic chuck, wherein the insulating system comprises:
a housing having a first surface and a second surface, wherein the second surface of the housing is disposed proximate the base;
a bore extending from the first surface toward the second surface, such that the bore comprises an open end at the first surface and a closed end proximate the second surface;
an opening disposed in the closed end, configured such that one of the one or more electrical contacts from the base passes through the opening and the bore, extends from the second surface past the first surface and contacts one of the one or more chuck electrodes; and
an insulating extender extending outward from the first surface and surrounding an end of the one of the one or more electrical contacts.

9. The semiconductor processing system of claim 8, wherein the second surface is glued to the base using an epoxy.

10. The semiconductor processing system of claim 8, wherein a sheet of material having a high dielectric constant is disposed between the base and the second surface.

11. The semiconductor processing system of claim 8, wherein O-rings are disposed between the base and the second surface.

12. An insulating system, comprising:
a housing having a first surface and a second surface, having a bore therethrough extending from the first surface to the second surface, configured such that an electrical contact may pass through the bore; and
an insulating extender disposed proximate the first surface and the second surface and surrounding two ends of the electrical contact, wherein the insulating extender extends outward from at least one of the first surface and the second surface.

13. The insulating system of claim 12, wherein the housing comprises a ceramic material or a plastic.

14. The insulating system of claim 12, wherein the insulating extender comprises a bellows that is disposed through a length of the bore and surrounds the electrical contact.

15. The insulating system of claim 12, wherein the insulating extender comprises two pistons disposed within the bore;
- wherein a first piston is proximate the first surface and a second piston is proximate the second surface;
- wherein each piston comprising a hollow cylinder through which the electrical contact passes;
- wherein each piston comprises an insulating material; and
- further comprising a spring disposed in the bore, biasing the first piston and the second piston outward.

16. The insulating system of claim 15, further comprising an O-ring disposed on an outer surface of the first piston and an O-ring disposed on an outer surface of the second piston.

17. The insulating system of claim 15, wherein a diameter of the pistons is such that an entirety of the pistons fits within the bore.

18. The insulating system of claim 15, wherein the pistons each comprise a cylindrical portion that fits within the bore and an outward protrusion having a diameter greater than a diameter of the bore such that a portion of the pistons is always disposed outside the housing.

19. A semiconductor processing system, comprising:
- a base comprising one or more electrical contacts;
- an electrostatic chuck having one or more chuck electrodes; and
- an insulating system, disposed between the base and the electrostatic chuck, wherein the insulating system comprises:
  - a housing having a first surface and a second surface, wherein the second surface of the housing is disposed proximate the base;
    - a bore extending from the first surface to the second surface, configured such that one of the one or more electrical contacts passes through the bore and contacts one of the one or more chuck electrodes; and
  - an insulating extender disposed proximate the first surface and the second surface and surrounding two ends of the one of the one or more electrical contacts, wherein the insulating extender extends outward from at least one of the first surface and the second surface.

20. The semiconductor processing system of claim 19, wherein the insulating extender comprises two pistons disposed within the bore;
- wherein a first piston is proximate the first surface and a second piston is proximate the second surface;
- wherein each piston comprising a hollow cylinder through which the one of the one or more electrical contacts passes;
- wherein each piston comprises an insulating material; and
- further comprising a spring disposed in the bore, biasing the first piston and the second piston outward.

* * * * *